United States Patent [19]
Piano

[11] Patent Number: 5,631,091
[45] Date of Patent: May 20, 1997

[54] BISMUTH COATING PROTECTION FOR COPPER

[75] Inventor: Anthony M. Piano, Lodi, N.J.

[73] Assignee: Fry's Metals, Inc., Providence, R.I.

[21] Appl. No.: 524,123

[22] Filed: Aug. 25, 1995

Related U.S. Application Data

[63] Continuation of Ser. No. 214,050, Mar. 17, 1994, abandoned.

[51] Int. Cl.$^6$ ........................................ B32B 9/00
[52] U.S. Cl. .................. 428/469; 428/457; 106/1.22; 106/1.23; 106/1.25; 106/1.26
[58] Field of Search ......................... 428/457, 469; 106/1.22, 1.23, 1.25, 1.26

[56] References Cited

U.S. PATENT DOCUMENTS

| | | | |
|---|---|---|---|
| 3,268,353 | 8/1966 | Melillo | 117/47 |
| 3,303,029 | 2/1967 | Shipley | 106/1 |
| 3,615,892 | 10/1971 | Heinzelman, Jr. | 148/6.15 |
| 4,014,660 | 3/1977 | Schreiner et al. | 29/183.5 |
| 4,441,118 | 4/1984 | Fister et al. | 357/70 |
| 4,935,312 | 6/1990 | Nakayama et al. | 428/642 |
| 5,306,335 | 4/1994 | Senda et al. | 106/1.22 |

FOREIGN PATENT DOCUMENTS

| | | |
|---|---|---|
| 549500 | 3/1977 | Russian Federation . |
| 637457 | 12/1978 | Russian Federation . |
| 779432 | 11/1980 | Russian Federation . |
| 1631634 | 2/1991 | Russian Federation . |
| 1798379 | 2/1993 | Russian Federation . |

OTHER PUBLICATIONS

Cavallotti et al, "Tin and Bismuth Substitutes For Electrodeposited Lead," *Proc. AESF Annu. Tech. Conf.* (1994), 81st, pp. 499–508 (English Abstract Only).

Kalugin et al, "Deposition of a Tin–Bismuth Alloy From Solutions With Sulfur–Containing Ligands By a Displacement Reaction," *Gal'vanotekh, Obrab. Poverkhn.* (1992), 1(3–4), pp. 55–56 (with English Abstract).

Kudryavtsev et al, "Electrodeposition of Tin–Based Alloys As Functional Coatings," Plating and Surface Finishing, Jul. 1992, pp. 57–61.

*Primary Examiner*—Patrick Ryan
*Assistant Examiner*—Cathy F. Lam
*Attorney, Agent, or Firm*—Shapiro and Shapiro

[57] ABSTRACT

Copper-containing surfaces, such as a copper surface for use in an electrical circuit, are protected by the provision of a bismuth coating.

32 Claims, No Drawings

BISMUTH COATING PROTECTION FOR COPPER

This is a continuation of application Ser. No. 08/214,050 filed Mar. 17, 1994, now abandoned.

FIELD OF THE INVENTION

The present invention is related to the protection of copper-containing surfaces, and is more particularly concerned with the novel use of protective bismuth coatings for such surfaces and with methods of coating application. The invention is especially advantageous in connection with the protection of copper surfaces of substrates used in electronics assembly, such as printed circuit substrates.

BACKGROUND OF THE INVENTION

The use of protective coatings for copper-containing surfaces is well known. Coatings may be applied for such purposes as to prevent tarnishing, to improve/preserve solderability, to improve corrosion resistance, and to reduce contact resistance between mating parts.

Printed circuit substrates for electronics applications, for example, generally include copper connectors such as copper pads for the mounting of surface-mount type electronic devices and/or copper plated through holes for receiving the leads of pin-in-hole type electronic devices. The surfaces of such connectors are commonly provided with a lead-tin alloy coating in practice. Tin-containing coatings are problematic, however, in that they may degrade with time due to the formation of copper-tin intermetallics. These intermetallic compounds form at the boundary between the copper and tin-containing coating and grow through the coating. The inter-metallic compounds form even at room temperature. Heating, such as during soldering, serves to accelerate the process. The problem of intermetallic compound formation becomes even more significant in connection with emerging electronics manufacturing technologies, wherein printed circuit substrates are subjected to multiple heating cycles.

Organic coatings, such as imidazoles, benzimidazoles, and triazoles have been considered as possible alternatives to lead-tin coatings. However, such coatings are subject to oxidation or volatilization when exposed to the heat of electronics manufacturing processes, with a resultant loss of protection. Moreover, organic coatings fall short of hole-fill requirements after wave soldering, particularly with the use of no-clean type soldering fluxes which are seeing increasing use in the electronics industry.

SUMMARY OF THE INVENTION

In accordance with the present invention, it has been discovered that the above-discussed deficiencies of tin-containing and organic coatings can be overcome, and that superior and cost-effective surface protection can be achieved, through the use of bismuth as a protective coating material. Bismuth has been found to provide a number of significant advantages over tin-containing and organic coatings. Unlike tin-containing coatings, bismuth does not form intermetallics with copper. Thus, a bismuth coating is not subject to the degradation by intermetallics which characterizes tin-containing coatings. Bismuth is also not subject to the oxidation/volatilization problems which characterize organic coatings. Furthermore, due to its high surface energy, bismuth exhibits highly effective wetting during wave soldering, drawing molten solder up into plated through-holes by capillary force to provide excellent hole-fill. When a bismuth coating is applied by immersion plating methods, as described hereinafter, the invention achieves a very flat coating which is ideally suited for surface mount assembly.

Thus, in accordance with one of its principal aspects, the present invention provides an article having a copper-containing surface coated with bismuth.

In accordance with another of its principal aspects, the invention provides a method of protecting a copper-containing surface, comprising the step of coating the surface with bismuth.

In accordance with another of its principal aspects, the invention provides a method of protecting a copper-containing surface, comprising the step of coating the surface with a metallic coating which does not form intermetallics with copper of the surface and which contains bismuth.

In accordance with still another of its principal aspects, the invention provides a method of protecting a copper-containing surface, wherein the surface is treated with a solution containing an acid solubilized bismuth salt.

In accordance with still another of its principal aspects, the invention provides a bismuth coating composition, comprising an acid soluble bismuth salt and an acid.

In accordance with still another of its principal aspects, the invention provides a protective coating, comprising a bismuth deposition from an immersion plating bath containing an acid solubilized salt of bismuth.

The foregoing and other aspects of the invention will be more fully appreciated from the description of the preferred embodiments hereinafter.

DESCRIPTION OF THE PREFERRED EMBODIMENTS

The present invention will now be described in detail with respect to the illustrative case of protecting a copper surface, such as of a printed circuit substrate or the like, although it will be readily appreciated that the invention is not limited to such applications.

In accordance with the preferred practice of the invention, bismuth is deposited on the copper surface in an immersion-plating bath containing a bismuth salt and an acid. An iodide is preferably added either directly to the plating bath (solution) or to a pre-plating bath (solution). Wetting agents and/or grain refiners may be incorporated into either bath. Although other coating techniques may be useful in practicing the invention, the immersion plating process is preferred because it requires no external electric current and no reducing agent for metal deposition to occur, in addition to providing a very flat coating which is highly desirable for surface mounting of components.

The bismuth used in the coating solution of the present invention is preferably in the form of a bismuth salt such as bismuth trioxide, and the like. The bismuth salt is dissociated in an acidic solution to form bismuth ions that are then deposited on the copper surface.

The acid used in the coating is preferably strong acid such as hydrochloric acid. Another suitable acid is hydrobromic acid. The acid solubilizes the bismuth salt and raises the potential of the copper above that of bismuth thus allowing the reaction to proceed.

In a preferred embodiment of the invention, the copper surface is complexed with an iodide. The iodide is preferably provided in the form of potassium iodide, sodium iodide, hydriodic acid or organic iodide. The iodide may be added either directly to the plating solution or to a pre-plating solution. The iodide complexes with the copper surface operating to direct the course of the reaction so as to ensure optimum crystal structure of the subsequent bismuth deposit. The use of a complexed iodide/copper surface increases the adhesion of the bismuth. The iodide/copper complex may be formed prior to immersion of the copper surface in the bismuth immersion plating bath by means of a pre-plating solution containing the iodide. Or, the iodide may be added directly to the plating solution.

Wetting agents may be added to lower the surface tension of the solution and to ensure uniform wetting of surfaces.

Typical working bath parameters are as follows:

| | |
|---|---|
| Bismuth Trioxide | 5–20 g/l |
| Hydrochloric Acid, 37% | 50–200 ml/l |
| Potassium Iodide | .5–5.0 g/l |
| Wetting Agent | 0–1 g/l |
| Deionized Water | (remainder) |
| Operating Temperature | 120–200 F. |
| Immersion Time | 30 sec–5 min |

Grain refiners and other additives may also be used as required to obtain the desired characteristics. Crystal structure, deposit properties and thickness can be modified by varying the above operating parameters.

Although not essential to the practice of the present invention, the addition of certain complexing agents was found to provide the added benefit of slowing the deposition rate and hence thus enhancing the metallic characteristics and the durability of the deposited bismuth coating. A modified version of said standard immersion plating formula can be prepared by incorporating glycolic acid, monoethanolamine (or monoethanolamine hydrochloride), N-Methyl pyrolidone or combinations thereof.

These said complexing agents or combinations of said complexing agents act to control the crystal growth of the subsequent deposit probably by altering the reaction path at the reaction interface. The microfine grain structure so produced may be preferable over that produced with said standard formulation. An exemplary concentration range of from about 5 percent to about 30 percent of total said complexing agent(s) is preferred although other concentrations as well as other complexing agents are also contemplated as being within the scope of the present invention.

In addition to the Immersion Bismuth itself, standard pretreatment steps such as cleaning and Copper microetching should be performed to ensure good adhesion of the Bismuth deposit to the Copper surfaces.

A further understanding of the present invention is presented in the following non-limiting examples.

EXAMPLE 1

Three 3½"×4" FR-4 test panels were processed using the present invention. Each panel contained 50 plated through-holes of various diameters for hole-fill evaluation after wave solder and solid Copper pad areas for solderability testing. The panels were all processed using the following sequence of operations:
1. Clean (1 minute)
2. Tap Water Rinse (30 seconds)
3. Microetch (2 minutes)
4. Tap Water Rinse
5. Sulfuric Acid, 10% (30 seconds)
6. Tap Water Rinse
7. Immersion Bismuth (1 minute)
8. Tap Water Rinse (30 seconds)
9. Dry Bath 1 was a room temperature Isopropanol rinse. Its purpose was to remove fingerprints, grease and other contaminants from Copper surfaces. Those skilled in the art will appreciate that other suitable acid or alkaline cleaning systems may be substituted.

Bath 3 contained 100 g/l of Sodium Persulfate and ½% by volume concentrated Sulfuric Acid. The remainder was deionized water. Its purpose was to remove about 40 microinches of Copper from the test substrate in order to ensure proper adhesion of the subsequent Bismuth deposit. This bath was also used at room temperature. Those skilled in the art will appreciate that other types of microetchants including but not limited to sulfuric acid/hydrogen peroxide and ferric chloride based systems may be substituted.

Bath 5 contained 10% by volume concentrated Sulfuric Acid. The remainder was deionized water. Its purpose was to remove any Persulfate residue remaining on the Copper surfaces from bath 3. This bath was used at room temperature.

Bath 7 was prepared by solubilizing 5 g of Bismuth Trioxide in 50 ml of Hydrochloric Acid, 37%. Sufficient water to make 1 liter was then added. 1.25 g of Potassium Iodide was added to the final solution. The bath was then heated to 160° F. (71° C.).

Baths 2, 4, 6 and 8 were flowing rinses to prevent carryover of chemicals from previous baths.

Following this process sequence, the test panels were then subjected to 0, 1, 2, and 3 IR reflow cycles to simulate solder paste application and other assembly processes. The following parameters were used for each cycle:

| Heat Stage | Top | Bottom |
|---|---|---|
| 1 | 125 | 125 C. |
| 2 | 200 | 200 C. |
| 3 | 325 | 325 C. |

Following IR cycling, the test panels were roller coated with NR 300 A2 water based no clean flux. This flux is available from Alpha Metals, Jersey City, N.J.

The panels were then passed through a wave solder machine at 5.00 feet per minute. The three preheat stations were each set at 375° F. The solder temperature was 500° F. After wave solder the following observations were made regarding hole-fill and solderability.

| IR Cycles | Hole-Fill (%) | Solderability |
|---|---|---|
| 0 | 100 | Excellent |
| 1 | 100 | Excellent |
| 2 | 100 | Excellent |
| 3 | 90 | Excellent |

% hole-fill refers to the number of holes that exhibit complete solder filling from one side of the panel to the other side (with total land wetting) divided by the total number of holes in the panel times 100.

EXAMPLE 2

An identical test panel substrate was treated as in example 1 to form a substantially uniform bismuth deposit in the through-holes and on the copper surfaces. However, the potassium iodide was applied in a separate solution prior to the bismuth plating solution. This pre-plating solution was prepared as follows.

dissolving approximately 5 g per liter of potassium iodide in deionized water;

adding approximately 50 ml per liter of hydrochloric acid to said solution;

heating said solution to approximately 150° F.

The test substrate was pre-cleaned as in example 1, immersed in this pre-plating solution for 5 minutes, rinsed in tap water and then immersed in the bismuth plating solution as in example 1 but without the added potassium iodide. Hole-fill and solderability tests were accomplished as described in example 1 with comparable results.

EXAMPLE 3

An identical test panel substrate was treated as in example 1 to form a substantially uniform bismuth coating in the through-holes and on the copper surfaces. The bismuth plating solution was prepared by substituting bismuth (III) chloride for bismuth (III) trioxide on a mole for mole basis. Hole-fill and solderability tests were accomplished as in example 1 with comparable results.

Example 4

An identical test panel substrate was treated as in example 1 to form a substantially uniform bismuth deposit in the through-holes and on the copper surfaces of said substrate. However, the immersion plating solution of bath 7 was prepared as follows.

Solubilizing 5 grams of bismuth trioxide in 200 ml of hydrochloric acid, 37%;

adding 100 grams of glycolic acid, 70% to said solution;

adding 100 grams of N-Methyl Pyrolidone to said solution;

adding 100 grams of monoethanolamine to said solution;

adding 1 gram of potassium iodide to said solution;

adding sufficient de ionized water to make 1 liter of said solution;

heating said solution to approximately 150° F.

The test substrate was pre-cleaned as in example 1, immersed in this plating solution for 2 minutes, rinsed in tap water and dried. Subsequent examination of the resultant deposit showed it to be uniform, shiny and more metallic in appearance than that obtained from example 1. Hole-fill and soldering tests were also accomplished as in example 1 with comparable results.

Having thus described the preferred exemplary embodiments of this present invention, it should be noted by those skilled in the art that the disclosures herein are exemplary only and that alternatives, adaptations, and modifications may be made within the scope of the present invention. Accordingly, the present invention is not limited to the specific embodiments illustrated herein.

I claim:

1. A coating composition which is effective for immersion plating a coating of bismuth metal onto a copper-containing surface and which comprises an acid solubilized bismuth salt and an iodide.

2. The coating composition of claim 1 wherein said bismuth salt is selected from the group consisting of bismuth trioxide and bismuth chloride.

3. The coating composition of claim 1, wherein said acid is selected from the group consisting of hydrochloric acid and hydrobromic acid.

4. The coating composition of claim 1, wherein said iodide is selected from the group consisting of potassium iodide, sodium iodide, hydriodic acid, and organic iodide.

5. The coating composition of claim 1, further comprising a complexing agent.

6. The coating composition of claim 5, wherein said complexing agent is selected from the group consisting of glycolic acid, N-methyl pyrolidone, monoethanolamine, and monoethanolamine hydrochloride.

7. The coating composition of claim 1, in the form of an aqueous solution.

8. A coating composition which is effective for immersion plating a coating of bismuth metal onto a copper-containing surface and which consists essentially of bismuth salt, halogen acid, and water, with or without an addition of iodide and/or complexing agent.

9. The coating composition of claim 8, wherein an iodide is present.

10. The coating composition of claim 9, wherein said iodide is selected from the group consisting of potassium iodide, sodium iodide, hydriodic acid, and organic iodide.

11. The coating composition of claim 8, wherein at least one complexing agent is present.

12. The coating composition of claim 11, wherein said complexing agent is selected from the group consisting of glycolic acid, N-methyl pyrolidone, monoethanolamine, and monoethanolamine hydrochloride.

13. The coating composition of claim 8, wherein both an iodide and at least one complexing agent are present.

14. The coating composition of claim 13, wherein said iodide is selected from the group consisting of potassium iodide, sodium iodide, hydriodic acid, and organic iodide.

15. The coating composition of claim 13, wherein said complexing agent is selected from the group consisting of glycolic acid, N-methyl pyrolidone, monoethanolamine, and monoethanolamine hydrochloride.

16. The coating composition of claim 8, wherein the halogen acid includes an acid selected from the group consisting of hydrochloric acid and hydrobromic acid.

17. The composition of claim 1, wherein the concentration of bismuth salt is at least about 5 grams/liter.

18. The composition of claim 17, wherein the concentration of bismuth salt does not exceed about 20 grams/liter.

19. The composition of claim 1, wherein the concentration of iodide does not exceed about 5 grams/liter.

20. The composition of claim 19, wherein the concentration of iodide is at least about 0.5 grams/liter.

21. The composition of claim 1, wherein the concentration of bismuth salt is at least about 5 grams/liter and the concentration of iodide does not exceed about 5 grams/liter.

22. The composition of claim 21, wherein the concentration of iodide is at least about 0.5 grams/liter.

23. The composition of claim 21 wherein the concentration of bismuth salt does not exceed about 20 grams/liter.

24. The composition of claim 23, wherein the concentration of iodide is at least about 0.5 grams/liter.

25. The composition of claim 8, wherein the concentration of bismuth salt is at least about 5 grams/liter.

26. The composition of claim 25, wherein the concentration of bismuth salt does not exceed about 20 grams/liter.

27. The composition of claim 8, wherein the concentration of iodide does not exceed about 5 grams/liter.

28. The composition of claim 27, wherein the concentration of iodide is at least about 0.5 grams/liter.

29. The composition of claim 8, wherein the concentration of bismuth salt is at least about 5 grams/liter and the concentration of iodide does not exceed about 5 grams/liter.

30. The composition of claim 29, wherein the concentration of iodide is at least about 0.5 grams/liter.

31. The composition of claim 29, wherein the concentration of bismuth salt does not exceed about 20 grams/liter.

32. The composition of claim 31, wherein the concentration of iodide is at least about 0.5 grams/liter.

\* \* \* \* \*